United States Patent
Niwano

(10) Patent No.: US 11,006,511 B2
(45) Date of Patent: May 11, 2021

(54) LASER DEVICE AND EXTREME ULTRAVIOLET LIGHT GENERATION DEVICE USING DELAY DETERMINATION AT A SHUTTER

(71) Applicant: Gigaphoton Inc., Tochigi (JP)

(72) Inventor: Motoki Niwano, Oyama (JP)

(73) Assignee: Gigaphoton Inc., Tochigi (JP)

( * ) Notice: Subject to any disclaimer, the term of this patent is extended or adjusted under 35 U.S.C. 154(b) by 69 days.

(21) Appl. No.: 16/379,511

(22) Filed: Apr. 9, 2019

(65) Prior Publication Data

US 2019/0239330 A1  Aug. 1, 2019

Related U.S. Application Data

(63) Continuation of application No. PCT/JP2016/083595, filed on Nov. 11, 2016.

(51) Int. Cl.
*H05G 2/00* (2006.01)
*H01S 3/23* (2006.01)
(Continued)

(52) U.S. Cl.
CPC ......... *H05G 2/008* (2013.01); *G03F 7/70033* (2013.01); *H01S 3/09702* (2013.01); *H01S 3/10* (2013.01); *H01S 3/1003* (2013.01); *H01S 3/10046* (2013.01); *H01S 3/1068* (2013.01); *H01S 3/115* (2013.01); *H01S 3/2308* (2013.01);
(Continued)

(58) Field of Classification Search
None
See application file for complete search history.

(56) References Cited

U.S. PATENT DOCUMENTS

2013/0032735 A1* 2/2013 Nowak ............... H01S 3/2316
                                                                      250/504 R
2016/0087389 A1   3/2016 Niwano et al.
2017/0317464 A1  11/2017 Kurosawa et al.

FOREIGN PATENT DOCUMENTS

JP       H10-163550 A      6/1998
JP       2013-065804 A     4/2013
(Continued)

OTHER PUBLICATIONS

Zapka et al., Pulse slicing with Pockels cell shutters, 15 J. Phys. E: Sci. Instrum. 298 (1982) (Year: 1982).*

(Continued)

*Primary Examiner* — James Choi
(74) *Attorney, Agent, or Firm* — Studebaker & Brackett PC

(57) ABSTRACT

A laser device includes: a master oscillator (100) configured to output a pulse laser beam (L) based on a light emission trigger signal (S21); a delay circuit (153) configured to generate a switching signal (S10) after a predetermined delay time has elapsed since reception of the light emission trigger signal (S21); a high voltage switch (304) configured to generate a high voltage pulse based on the switching signal (S10); an optical shutter (32k) positioned on the optical path of the pulse laser beam (L) and driven based on the high voltage pulse; and a high voltage monitor (151) configured to detect the high voltage pulse and transmit a high voltage pulse sensing signal (S6) to the delay circuit (153). The delay circuit (153) determines the delay time based on the light emission trigger signal (S21) and the high voltage pulse sensing signal (S6).

18 Claims, 14 Drawing Sheets

(51) Int. Cl.
      *H01S 3/115*       (2006.01)
      *H01S 3/097*       (2006.01)
      *H01S 3/10*         (2006.01)
      *H01S 3/106*       (2006.01)
      *G03F 7/20*        (2006.01)
      *H01S 3/223*       (2006.01)
      *H01S 3/16*        (2006.01)

(52) U.S. Cl.
      CPC .......... *H01S 3/2316* (2013.01); *H01S 3/1643* (2013.01); *H01S 3/2232* (2013.01); *H01S 3/2375* (2013.01)

(56) References Cited

FOREIGN PATENT DOCUMENTS

| | | |
|---|---|---|
| JP | 2015-026668 A | 2/2015 |
| JP | 2015-038922 A | 2/2015 |
| WO | 2016/142995 A1 | 9/2016 |

OTHER PUBLICATIONS

International Search Report issued in PCT/JP2016/083595; dated Mar. 28, 2017.
Notification of Transmittal of Translation of the International Preliminary Report on Patentability (Chapter I) and Translation of Written Opinion of the International Searching Authority; PCT/JP2016/083595; dated May 14, 2019.

* cited by examiner

LASER DEVICE AND EXTREME ULTRAVIOLET LIGHT GENERATION DEVICE USING DELAY DETERMINATION AT A SHUTTER

CROSS-REFERENCE TO RELATED APPLICATIONS

The present application is a continuation application of International Application No. PCT/JP2016/083595 filed on Nov. 11, 2016. The content of the application is incorporated herein by reference in its entirety.

BACKGROUND

1. Technical Field

The present disclosure relates to a laser device and an extreme ultraviolet light generation device including the laser device.

2. Related Art

Recently, refinement of a transfer pattern in optical lithography of a semiconductor process has been rapidly proceeding along with refinement of the semiconductor process. Minute fabrication at 20 nm or smaller will be requested for the next generation technology. To meet the request for minute fabrication at 20 nm or smaller, for example, it is desired to develop an exposure device including an extreme ultraviolet light generation device configured to generate extreme ultraviolet (EUV) light at a wavelength of 13.5 nm in combination with reduced projection reflective optics.

Disclosed EUV light generation devices include the three kinds of devices of a laser produced plasma (PLOP) device that uses plasma generated by irradiating a target material with a pulse laser beam, a discharge produced plasma (DPP) device that uses plasma generated by electrical discharge, and a free electron laser device that uses an electron output from an electron accelerator.

LIST OF DOCUMENTS

Patent Documents

Patent Document 1: Japanese Unexamined Patent Application Publication No. 2015-026668
Patent Document 2: Japanese Unexamined Patent Application Publication No. 2015-038922
Patent Document 3: Japanese Unexamined Patent Application Publication No. 10-163550

SUMMARY

A laser device according to an aspect of the present disclosure includes: a laser control unit configured to generate a light emission trigger signal; a master oscillator configured to output a pulse laser beam based on the light emission trigger signal transmitted from the laser control unit; a delay circuit configured to receive the light emission trigger signal transmitted from the laser control unit and generate a switching signal after a predetermined delay time has elapsed since the reception; a high voltage switch configured to generate a high voltage pulse based on the switching signal transmitted from the delay circuit; an optical shutter positioned on the optical path of the pulse laser beam output from the master oscillator and driven based on the high voltage pulse output from the high voltage switch; and a high voltage monitor configured to detect the high voltage pulse output from the high voltage switch and transmit a high voltage pulse sensing signal to the delay circuit. The delay circuit determines the delay time based on the light emission trigger signal and the high voltage pulse sensing signal.

A laser device according to another aspect of the present disclosure includes: a laser control unit configured to receive an external trigger signal, generate a first light emission trigger signal after a first delay time has elapsed since the reception, and generate a second light emission trigger signal based on the external trigger signal; a master oscillator configured to output a pulse laser beam based on the first light emission trigger signal transmitted from the laser control unit; a delay circuit configured to receive the second light emission trigger signal transmitted from the laser control unit and generate a switching signal after a second delay time has elapsed since the reception; a high voltage switch configured to generate a high voltage pulse based on the switching signal transmitted from the delay circuit; an optical shutter positioned on the optical path of the pulse laser beam output from the master oscillator and driven based on the high voltage pulse output from the high voltage switch; and a high voltage monitor configured to detect the high voltage pulse output from the high voltage switch and transmit a high voltage pulse sensing signal to the laser control unit. The laser control unit determines the delay times based on the external trigger signal and the high voltage pulse sensing signal.

A laser device according to another aspect of the present disclosure includes: a laser control unit configured to generate a light emission trigger signal based on a received external trigger signal and generate a switching signal after a third delay time has elapsed since the reception of the external trigger signal; a master oscillator configured to output a pulse laser beam based on the light emission trigger signal transmitted from the laser control unit; a high voltage switch configured to generate a high voltage pulse based on the switching signal transmitted from the laser control unit; an optical shutter positioned on the optical path of the pulse laser beam output from the master oscillator and driven based on the high voltage pulse output from the high voltage switch; and a high voltage monitor configured to detect the high voltage pulse output from the high voltage switch and transmit a high voltage pulse sensing signal to the laser control unit. The laser control unit determines the third delay time based on the external trigger signal and the high voltage pulse sensing signal.

BRIEF DESCRIPTION OF THE DRAWINGS

Embodiments of the present disclosure will be described below as examples with reference to the accompanying drawings.

DESCRIPTION OF EMBODIMENTS

<Contents>
1. Overall description of EUV light generation device
1.1 Configuration
1.2 Operation
2. Comparative example
2.1 Configuration
2.2 Operation
2.3 Problem
3. Embodiment 1
3.1 Configuration of Embodiment 1
3.2 Operation of Embodiment 1
3.3 Effect of Embodiment 1
4. Embodiment 2
4.1 Configuration of Embodiment 2
4.2 Operation of Embodiment 2
4.3 Effect of Embodiment 2
5. Embodiment 3
5.1 Configuration of Embodiment 3
5.2 Operation of Embodiment 3
5.3 Effect of Embodiment 3

Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overall Description of EUV Light Generation Device 1.1 Configuration

Figure 1:
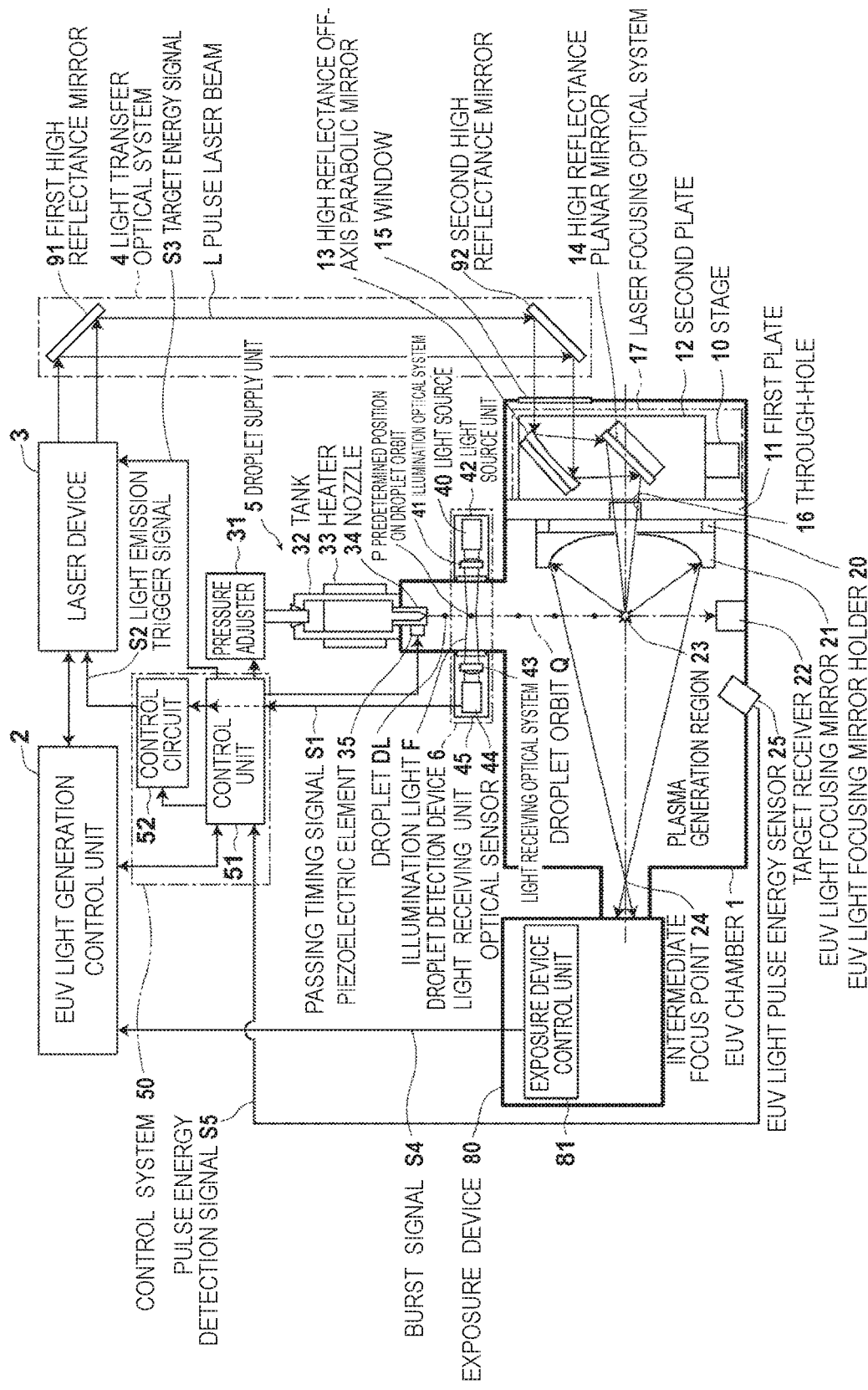
FIG. 1 is a schematic side view illustrating the entire configuration of a typical EUV light generation device.

FIG. 1 is a schematic side view illustrating the entire configuration of a typical extreme ultraviolet (EUV) light generation device. The EUV light generation device illustrated in FIG. 1 supplies an exposure device 80 with EUV light to be used as exposure light. Specifically, the EUV light generation device is constituted by components other than the exposure device 80 and an exposure device control unit 81 in FIG. 1. The EUV light generation device of the present example employs a laser generation plasma (LPP) scheme in which EUV light is generated by irradiating a target material with a laser beam to excite the target material. This EUV light generation device includes an EUV chamber 1, an EUV light generation control unit 2, a laser device 3, a light transfer optical system (beam delivery system) 4, a droplet supply unit 5, a droplet detection device 6, and a control system 50.

The EUV chamber 1 is a chamber for generating EUV light therein, and preferably a vacuum chamber. The EUV chamber 1 includes a stage 10, a first plate 11, a second plate 12 held in the EUV chamber 1 through the stage 10, a high reflectance off-axis parabolic mirror 13 held on the second plate 12, a high reflectance planar mirror 14 held on the second plate 12, and a laser beam introduction window 15. The first plate 11 is provided with a laser beam introduction through-hole 16. The high reflectance off-axis parabolic mirror 13 and the high reflectance planar mirror 14 constitute a laser focusing optical system 17 for focusing a pulse laser beam L to be described later.

The EUV chamber 1 further includes an EUV light focusing mirror holder 20, an EUV light focusing mirror 21 held by the EUV light focusing mirror holder 20, a target receiver 22, and an EUV light pulse energy sensor 25. The EUV light focusing mirror 21 includes a reflection surface having, for example, a spheroidal surface shape, and is disposed so that the first focal point thereof is positioned in a plasma generation region 23 and the second focal point thereof is positioned at an intermediate focus point (IF) 24. The EUV light pulse energy sensor 25 is disposed to detect the pulse energy of EUV light generated in the plasma generation region 23.

The laser device 3 generates the pulse laser beam L for exciting a target material. The laser device 3 is, for example, a master oscillator power amplifier type laser apparatus. Alternatively, the laser device 3 may be, for example, a combination of an yttrium aluminum garnet (YAG) laser device configured to generate a pre-pulse laser beam and a $CO_2$ laser device configured to generate a main pulse laser beam. Alternatively, the laser device 3 may be another laser device. The pulse laser beam L output from the laser device 3 has, for example, a pulse width of several ns to several tens ns approximately and a frequency of 10 kHz to 100 kHz approximately.

The light transfer optical system 4 includes a first high reflectance mirror 91 that reflects the pulse laser beam L output from the laser device 3 and changes the traveling direction thereof, and a second high reflectance mirror 92 that reflects, toward the window 15, the pulse laser beam L reflected by the first high reflectance mirror 91.

The droplet supply unit 5 supplies, as a spherical droplet DL into the EUV chamber 1, a target material such as tin (Sn) or lithium (Li) used to generate EUV light. The droplet supply unit 5 includes a pressure adjuster 31, a tank 32 that stores the target material in a melted state, a heater 33 configured to melt the target material, a nozzle 34 that discharges the target material in the melted state, and a piezoelectric element 35 configured to vibrate the sidewall of the nozzle 34. The operation of the pressure adjuster 31 is controlled by a control unit 51 of the control system 50. The droplet DL is intermittently and periodically generated and proceeds on a droplet orbit Q in the EUV chamber 1.

The droplet detection device 6 includes a light source unit 42 including a light source 40 such as a semiconductor laser configured to emit illumination light F having a wavelength, for example, in the visible range and an illumination optical system 41. The illumination optical system 41 focuses the illumination light F at a predetermined position P on the droplet orbit Q. When the droplet DL is present at the position P, the droplet DL partially blocks the illumination light F. The droplet detection device 6 also includes a light receiving unit 45 including a light receiving optical system 43 configured to focus the illumination light F and an optical sensor 44 configured to detect the focused illumination light F. The light receiving unit 45 is disposed facing to the light source unit 42.

The illumination optical system 41 includes, for example, a condenser lens. The illumination light F having emitted from the light source 40 and then passed through the illumination optical system 41 focuses at the position P. The light receiving optical system 43 includes, for example, a condenser lens. Having focused at the position P and then diffused, the illumination light F is focused through the light receiving optical system 43 and incident on the optical sensor 44.

1.2 Operation

In the above-described configuration, the target material in the tank 32 is heated to a predetermined temperature equal to or higher than the melting point thereof by the heater 33. For example, when the target material is Sn, Sn is heated to the temperature range of 250 to 290° C., which is equal to or higher than the melting point (232° C.) thereof. To perform the heating, the control unit 51 may control the operation of the heater 33 to perform temperature adjustment. The control unit 51 also controls the operation of the pressure adjuster 31 to maintain the pressure in the tank 32 at a pressure with which a jet of the melted target material is output at a predetermined speed from the nozzle 34. Then, the control unit 51 applies a droplet supply signal as a voltage signal having a predetermined waveform to the piezoelectric element 35 through a piezo power source (not illustrated). Accordingly, the piezoelectric element 35 vibrates, and the vibration is provided to the nozzle 34. In this manner, the jet output from the nozzle 34 is divided in a predetermined period due to the vibration of the nozzle 34 so that the droplet DL is intermittently supplied. The frequency of the vibration, in other words, the frequency of the droplet generation is set to be, for example, 50 kHz to 100 kHz approximately.

The illumination light F output from the light source unit 42 of the droplet detection device 6 is received by the light receiving unit 45. As the droplet DL falling after generated as described above passes through the predetermined position P on the orbit Q, the illumination light F is blocked by the droplet DL. In this case, the received-light quantity of the illumination light F detected by the light receiving unit 45 decreases, and the signal level of an output signal output from the light receiving unit 45 decreases in accordance with the decrease of the received-light quantity. The timing at which the signal level becomes smaller than a certain threshold voltage indicates the timing at which the droplet DL passes through the predetermined position P. The output signal output from the light receiving unit 45 is input as a passing timing signal S1 to a control circuit 52 through the control unit 51. The control circuit 52 includes a delay circuit 53 (refer to FIG. 2 to be described later). When having detected decrease of the signal level of the input passing timing signal S1, the control circuit 52 outputs a light emission trigger signal S2 a predetermined time after the detection.

The light emission trigger signal S2 is input to the laser device 3. Having received the light emission trigger signal S2, the laser device 3 outputs the pulse laser beam L as described later in detail. The pulse laser beam L is reflected at the first high reflectance mirror 91 and the second high reflectance mirror 92 of the light transfer optical system 4, and then incident into the EUV chamber 1 through the window 15.

The pulse laser beam L is reflected at the high reflectance off-axis parabolic mirror 13 and the high reflectance planar mirror 14 of the laser focusing optical system 17, and then passes through an opening provided at a central part of the EUV light focusing mirror 21 and proceeds on the optical axis of the EUV light focusing mirror 21. The pulse laser beam L focuses in the plasma generation region 23 due to the effect of the high reflectance off-axis parabolic mirror 13. The droplet DL having reached the plasma generation region 23 becomes plasma through irradiation with the focused pulse laser beam L. Then, EUV light is generated from the plasma. When not irradiated with the pulse laser beam L, the droplet DL is received by the target receiver 22.

The droplet DL is periodically generated, and the pulse laser beam L is output each time the droplet DL is detected by the droplet detection device 6. Accordingly, the EUV light is periodically generated. The EUV light periodically generated in this manner is incident on the exposure device 80 after having focused at the intermediate focus point 24. At the exposure device 80, the incident EUV light is used for semiconductor exposure or the like.

The exposure device control unit 81 of the exposure device 80 outputs a burst signal S4. The burst signal S4 is input to the control circuit 52 through the EUV light generation control unit 2 and the control unit 51. The outputting of the light emission trigger signal S2 is performed only while the burst signal S4 is input from the exposure device control unit 81 to the control circuit 52. When no burst signal S4 is input to the control circuit 52, no light emission trigger signal S2 is output whether or not the passing timing signal S1 is input to the control unit 51. Thus, no pulse laser beam L is output in this case, and thus no EUV light is generated.

The EUV light pulse energy sensor 25 illustrated in FIG. 1 detects the pulse energy of EUV light generated in the plasma generation region 23, and outputs a pulse energy detection signal S5 indicating the energy. The pulse energy detection signal S5 is input to the control unit 51 of the control system 50. The control unit 51 calculates a target value of the energy of the pulse laser beam L based on the pulse energy of the EUV light indicated by the pulse energy detection signal S5, and inputs a target energy signal S3 indicating the target value to the laser device 3. Accordingly, the energy of the pulse laser beam L output from the laser device 3 is set to be the target value.

The plasma generation region 23 is moved based on a command from the exposure device 80 in some cases. When the plasma generation region 23 is moved in a direction parallel to the droplet orbit Q, the delay time until the control unit 51 outputs the light emission trigger signal S2 after detection of decrease of the signal level of the passing timing signal S1 may be changed. When the plasma generation region 23 is moved in a plane orthogonal to the droplet orbit Q, the stage 10 may be actuated to move the high reflectance off-axis parabolic mirror 13 and the high reflectance planar mirror 14 through the second plate 12 in the plane orthogonal to the droplet orbit Q.

Figure 2:
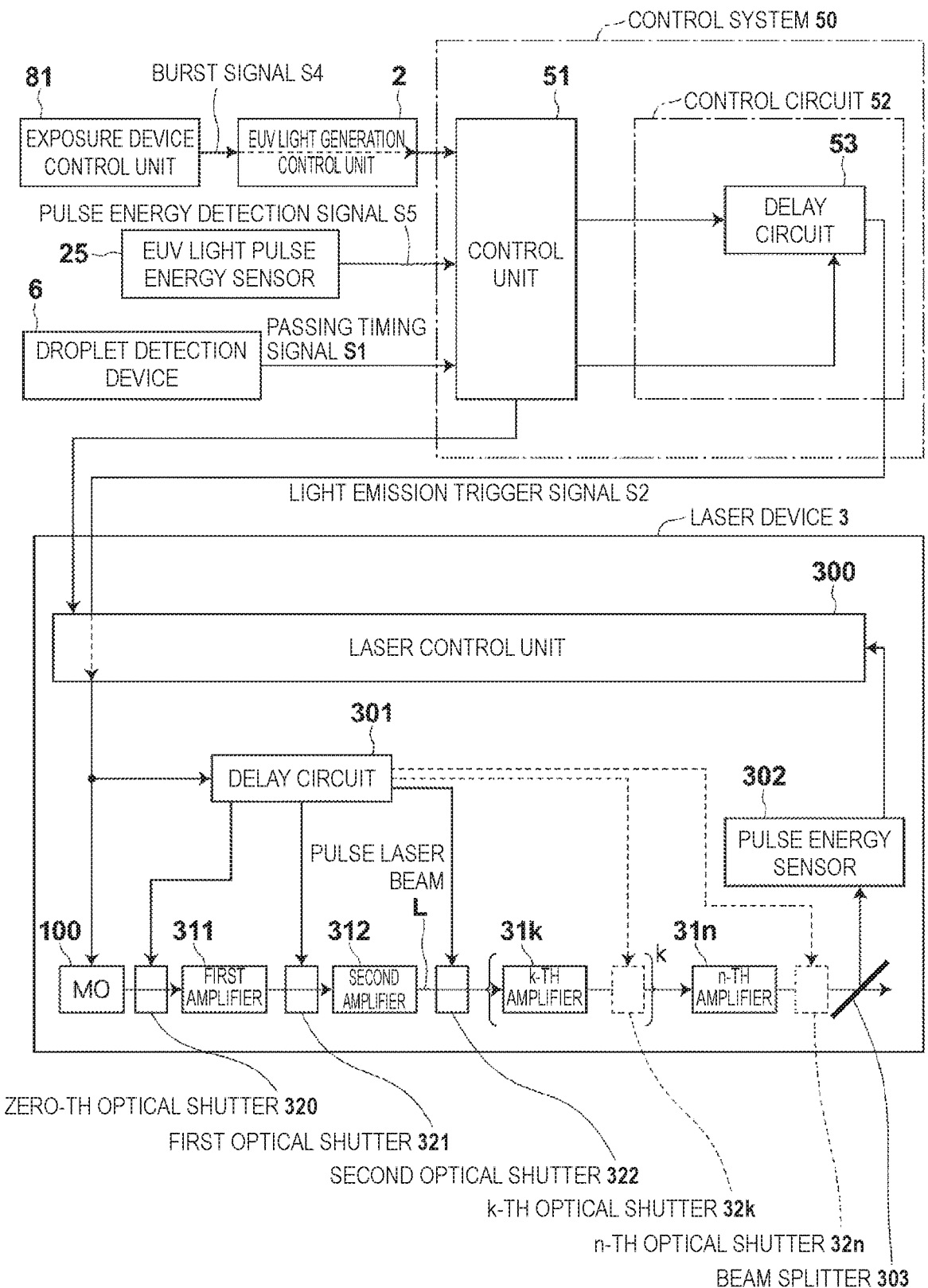
FIG. 2 is a block diagram schematically illustrating a main part of the EUV light generation device illustrated in FIG. 1.

FIG. 2 is a block diagram collectively illustrating the EUV light generation control unit 2, the exposure device control unit 81, the control system 50, the EUV light pulse energy sensor 25, and the droplet detection device 6 described above. As illustrated in FIG. 2, the control system 50 includes the delay circuit 53. The delay circuit 53 outputs the light emission trigger signal S2 a predetermined time after the passing timing signal S1 is input to the control system 50. The predetermined time is set so that, after having passed through the predetermined position P and reached the plasma generation region 23, the droplet DL illustrated in FIG. 1 is irradiated with the pulse laser beam L output from the laser device 3 having received the light emission trigger signal S2. Specifically, the predetermined time is, for example, the sum "Dt1+α" of a time Dt1 until the droplet DL reaches the plasma generation region 23 after having passed through the position P and a time α until the pulse laser beam L reaches the plasma generation region 23 after the light emission trigger signal S2 is input to the laser device 3. The control unit 51 of the control system 50 feeds data indicating the predetermined time to the delay circuit 53, and the delay time of the delay circuit 53 is set based on the data.

The block diagram in FIG. 2 illustrates the basic configuration of the laser device 3. As illustrated in FIG. 2, the laser device 3 includes a master oscillator 100 configured to emit a pulse laser beam, n amplifiers 311, 312, . . . , 31k, . . . , and 31n configured to sequentially amplify the laser beam, (n+1) optical shutters 320, 321, 322, . . . , 32k, . . . , and 32n, and a laser control unit 300. In FIG. 2, the master oscillator is referred to as MO, and each amplifier is referred to as PA. This notation also applies in the following description. The optical shutter closest to the MO 100 is referred to as the zero-th optical shutter 320. The first PA 31l, the first optical shutter 32l, . . . , the n-th PA 31n, and the n-th optical shutter 32n are sequentially disposed downstream of the zero-th optical shutter 320. The k-th PA 31k and the k-th optical shutter 32k are provided as a pair, as illustrated with parentheses denoted by k in FIG. 2, and n pairs thereof are provided in addition to the zero-th optical shutter 320.

The MO 100 is preferably, for example, a $CO_2$ laser oscillator including a Q switch or a quantum cascade laser (QCL) configured to oscillate in the amplification wavelength band of $CO_2$ laser gas. When having received the light emission trigger signal S2, the MO 100 outputs the pulse laser beam L. The pulse laser beam L may be a linearly polarized beam. The PAs 311, 312, . . . , 31k, . . . , and 31n may be each a discharge-pumped amplifier disposed on the optical path of the pulse laser beam L output from the MO 100 and containing $CO_2$ laser gas. The PAs 311, 312, . . . , 31k, . . . , and 31n may each include $CO_2$ laser gas, a pair of electrodes, and a power source for performing high frequency discharge between the electrodes. With this configuration, the $CO_2$ laser gas may be pumped so that a predetermined excitation intensity is achieved at each of the PAs 311, 312, . . . , 31k, . . . , and 31n. When the MO 100 has a small power (several tens mW) like the above-described QCL, the PAs 311, 312, . . . , 31k, . . . , and 31n may be each a regenerative amplifier including an optical resonator, an EO pockels cell, and a polarizer.

The (n+1) optical shutters 320, 321, 322, . . . , 32k, . . . , and 32n each have a function to open only in a short time in which a pulse laser beam is allowed to pass. This optical shutter function will be described later in detail. After having passed through the optical shutters 320, 321, 322, . . . , 32k, . . . , and 32n, a pulse laser beam becomes the pulse laser beam L having a high intensity through sequential amplification at the PAs 311, 312, . . . , 31k, . . . , and 31n.

The optical shutters 320, 321, 322, . . . , 32k, . . . , and 32n may each include an EO pockels cell or may each include an EO pockels cell and two polarizers. An optical shutter having low resistance to the pulse laser beam L is preferably disposed at a position on the upstream side where the pulse energy of the pulse laser beam L is relatively low, for example, between the MO 100 and the first PA 311 like the zero-th optical shutter 320 illustrated in FIG. 2.

Figure 3:
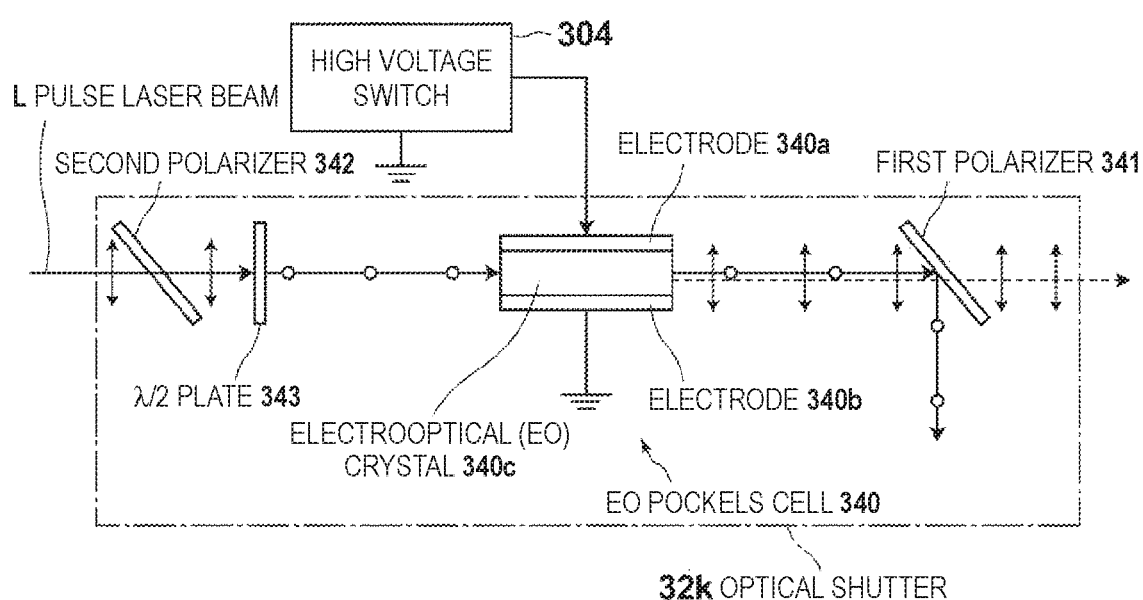
FIG. 3 is a schematic view illustrating an exemplary optical shutter.

FIG. 3 illustrates an exemplary optical shutter. This one optical shutter illustrated in FIG. 3 is representatively the optical shutter 32k. As illustrated in FIG. 3, the optical shutter 32k includes a first polarizer 341 and a second polarizer 342 disposed separately from each other, an EO pockels cell 340 disposed between the polarizers, and a λ/2 plate (½ wave plate) 343 disposed between the second polarizer 342 and the EO pockels cell 340. The EO pockels cell 340 includes, for example, electrodes 340a and 340b, and an electrooptical (EO) crystal 340c disposed between the electrodes. In the optical shutter 32k, high voltage at a predetermined value can be applied from a high voltage switch 304 controlled by a control circuit (not illustrated) to the electrooptical crystal 340c through the electrodes 340a and 340b. Upon the high voltage application, the electrooptical crystal 340c rotates the linear polarization direction of the passing pulse laser beam L by 90°.

In FIG. 3, orthogonally extending arrows and circles are provided along the optical path of the pulse laser beam L. Each arrow indicates that the linear polarization direction of the pulse laser beam L is in a direction (vertical direction) parallel to the sheet of FIG. 3, and each circle indicates that the linear polarization direction of the pulse laser beam L is in a direction orthogonal to the sheet. In this example, the pulse laser beam L passing through the optical shutter 32k from left to right in FIG. 3, in particular, the pulse laser beam L linearly polarized in the vertical direction in FIG. 3 is used. The linearly polarized pulse laser beam L transmits through the second polarizer 342, and the polarization direction thereof is rotated by 90° at the λ/2 plate 343. When the above-described high voltage is not applied to the electrooptical crystal 340c, the pulse laser beam L, the linear polarization direction of which has become orthogonal to the sheet in this manner, maintains the polarization direction intact and thus is reflected at the first polarizer 341, and consequently cannot pass through the optical shutter 32k. When the above-described high voltage is applied to the electrooptical crystal 340c, the linear polarization direction returns to a direction parallel to the sheet as the pulse laser beam L passes through the electrooptical crystal 340c, and accordingly, the pulse laser beam L transmits through the first polarizer 341 and passes through the optical shutter 32k. In this manner, the optical shutter 32k opens and closes depending on whether the high voltage application is performed. Similarly, for the pulse laser beam L passing through the optical shutter 32k from right to left in FIG. 3, the optical shutter 32k in the present example opens and closes depending on whether the high voltage application is performed.

The optical shutter may be an optical isolator having the function of allowing the pulse laser beam L to pass from left to right in FIG. 2 as described above and cutting off light moving from right to left in FIG. 2 upon high voltage application. In the configurations illustrated in FIGS. 1 and 2, part of the pulse laser beam L is reflected at a target in some cases. In addition, what is called self-oscillation occurs in some cases that spontaneously emitted light from each of the plurality of PAs is amplified at another PA. Self-oscillation light generated in the self-oscillation and light reflected at the target become return light and flow back toward the MO 100 through the optical path of the pulse laser beam L in some cases. When the optical isolator described above is used, damage on the laser device due to such return light can be reduced to stabilize outputting of the pulse laser beam L.

As illustrated in FIG. 2, part of the pulse laser beam L is reflected at a beam splitter 303, the remaining part transmits through the beam splitter 303 and is incident on the light transfer optical system 4 illustrated in FIG. 1. The pulse laser beam L reflected at the beam splitter 303 is incident on a pulse energy sensor 302. The pulse energy sensor 302 detects the energy of the pulse laser beam L and inputs an energy detection signal to the laser control unit 300. The laser control unit 300 controls the output of the MO 100 based on the energy detection signal to obtain a target energy indicated by the target energy signal S3 illustrated in FIG. 1. The beam splitter 303 is not limited to a position illustrated in FIG. 2, but may be disposed upstream of the position in the traveling direction of the pulse laser beam L.

The operation of the laser control unit 300 is controlled by the control unit 51 of the control system 50. When the burst signal S4 is not input to the control unit 51, high voltage application to the optical shutters 320, 321, 322, . . . , 32k, . . . , and 32n is not performed. In other words, only while the burst signal S4 is input to the control unit 51, the pulse laser beam L is allowed to pass through the optical shutters 320, 321, 322, . . . , 32k, . . . , and 32n upon the high voltage application. When the plurality of optical shutters 320, 321, 322, . . . , 32k, . . . , and 32n are provided in this manner, each optical shutter may be opened at a timing at which the pulse laser beam L passes through the optical shutter.

2. Comparative Example

2.1 Configuration

Figure 4:
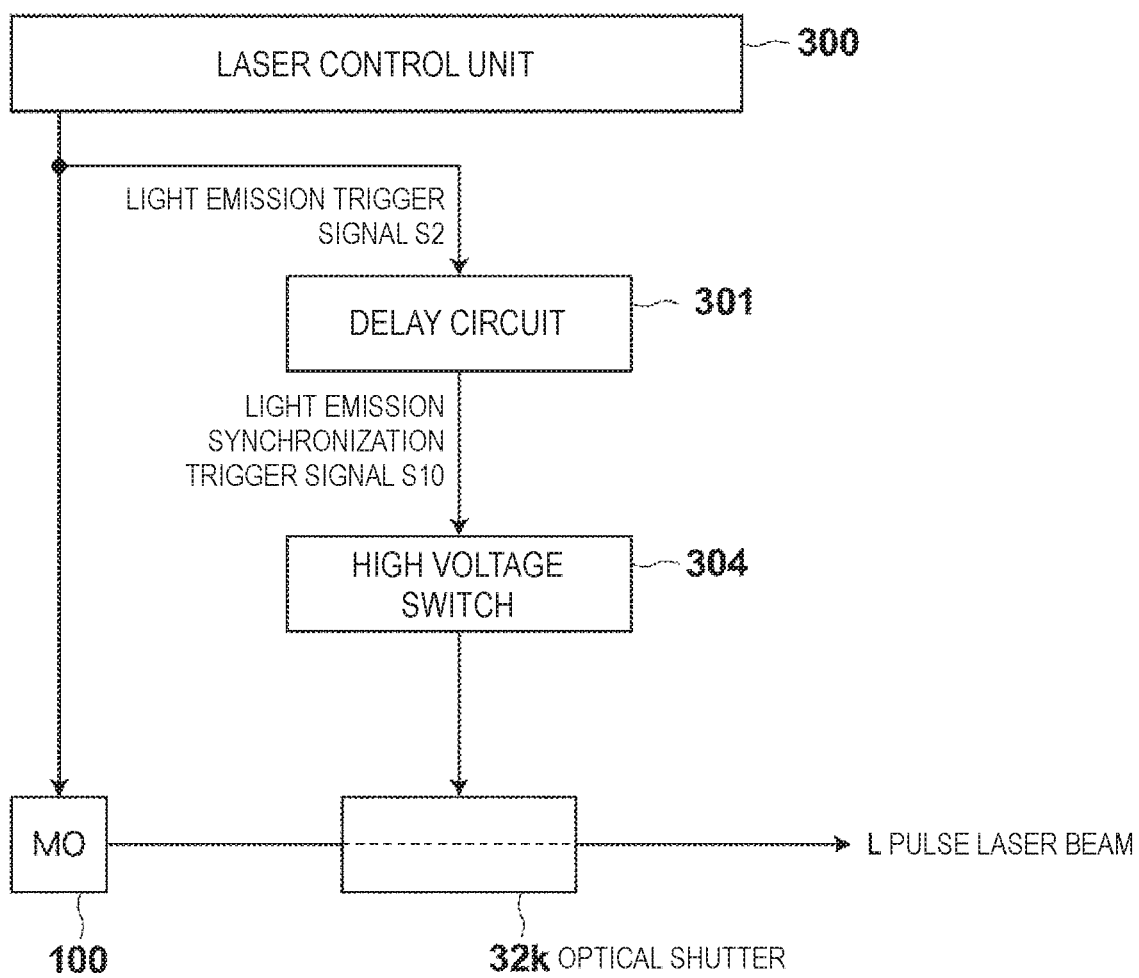
FIG. 4 is a block diagram illustrating a schematic configuration of a laser device as a comparative example.

The following describes a laser device as a comparative example with reference to FIG. 4. This laser device may be employed as the laser device 3 illustrated in FIGS. 1 and 2. FIG. 2 described above omits a configuration in which high voltage is applied to each of the optical shutters 320, 321, 322, . . . , 32k, . . . , and 32n. FIG. 4 illustrates the configuration in which high voltage is applied, and this configuration will be also described below in detail. The one optical shutter in FIG. 4 is representatively the optical shutter 32k, and a configuration around the optical shutter 32k will be described below. When a plurality of optical shutters are provided as illustrated in FIG. 2, the configuration illustrated in FIG. 4 may be provided for each optical shutter.

The laser device illustrated in FIG. 4 includes the laser control unit 300, the MO 100, the optical shutter 32k, a delay circuit 301, and the high voltage switch 304. After having passed through the laser control unit 300, the light emission trigger signal S2 is input to the MO 100 and the delay circuit 301. The optical shutter 32k includes, for example, the EO pockels cell 340 as illustrated in FIG. 3. The high voltage switch 304 includes, for example, a semiconductor switch and is connected with a high-voltage source (not illustrated).

2.2 Operation

After having received the light emission trigger signal S2, the MO 100 outputs a pulse laser beam. This pulse laser beam is amplified by, for example, a PA (not illustrated) as illustrated in FIG. 2 to obtain the pulse laser beam L having a high intensity. After having received the light emission trigger signal S2, the delay circuit 301 outputs a light emission synchronization trigger signal S10 in synchronization with the light emission trigger signal S2. The light emission synchronization trigger signal S10 is input to the high voltage switch 304. Having received the light emission synchronization trigger signal S10, the high voltage switch 304 performs a switching operation to apply a predetermined high voltage from the high-voltage source to the optical shutter 32k. The light emission synchronization trigger signal S10 is output from the delay circuit 301 a predetermined time after the light emission trigger signal S2 so that the high voltage is applied to the optical shutter 32k at a timing at which the pulse laser beam L passes through the optical shutter 32k. The optical shutter 32k as an optical switch allows the pulse laser beam L to pass while the high voltage is applied.

2.3 Problem

Figure 5:
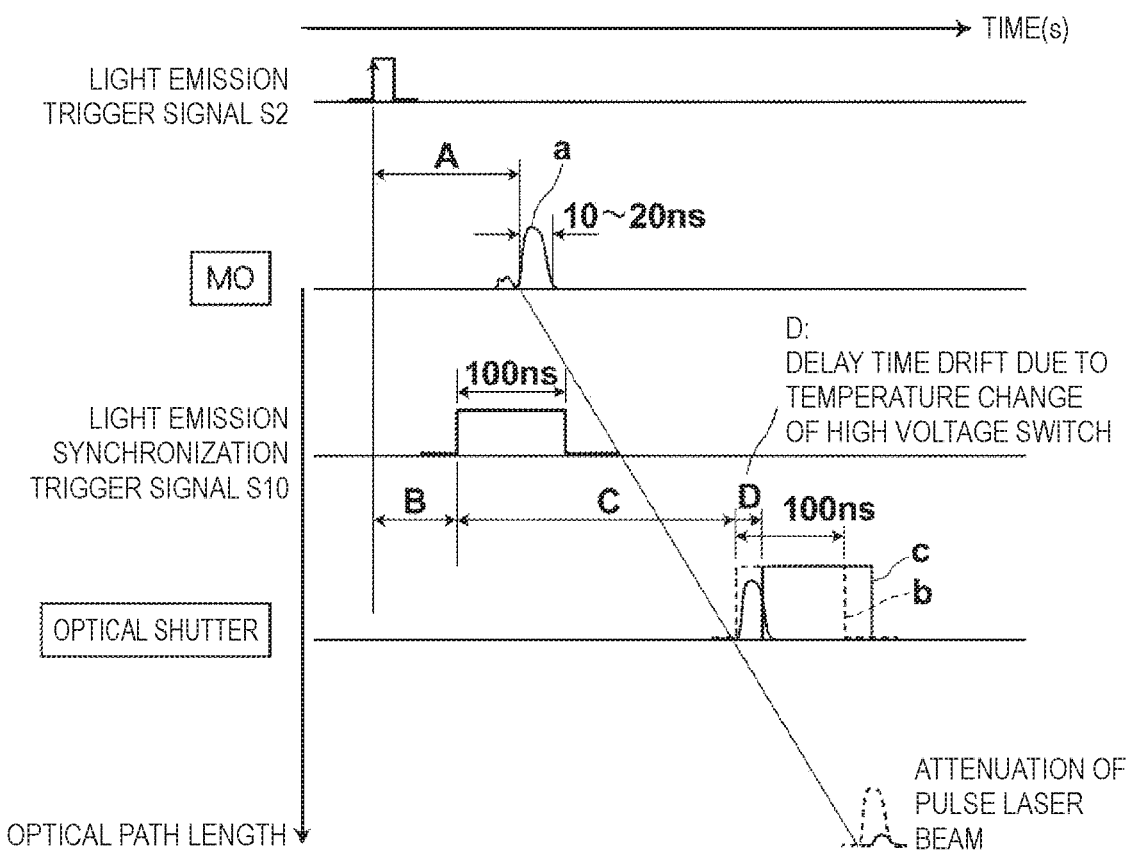
FIG. 5 is a timing chart illustrating the generation timing of each signal in the laser device illustrated in FIG. 4.

FIG. 5 is a timing chart illustrating the generation timing of each signal in the configuration in FIG. 4 together with the progress position of the pulse laser beam L. The following describes the generation timing with reference to FIG. 5. In FIG. 5, the horizontal axis represents time in s (seconds), for example. FIG. 5 illustrates, sequentially from the uppermost row toward the lower side, the waveforms and generation timings of the light emission trigger signal S2, the pulse laser beam L output from the MO 100, the light emission synchronization trigger signal S10, and the high voltage applied to the optical shutter 32k. A position on the downward arrow illustrated along the vertical axis corresponds to an optical path length from the MO 100 toward the optical shutter 32k side.

As illustrated in FIG. 5, the MO 100 outputs the pulse laser beam L having a waveform denoted by "a" when a substantially constant time A has elapsed since the rise of the light emission trigger signal S2. For example, the pulse width (full width at full maximum) of the pulse laser beam L is 10 to 20 ns approximately. For example, the pulse width of the light emission synchronization trigger signal S10 is 100 ns approximately. The waveform of the high voltage applied to the optical shutter 32k is denoted by "b" or "c" in FIG. 5. The pulse width of the high voltage corresponds to the pulse width of the light emission synchronization trigger signal S10, and thus is 100 ns approximately.

To apply high voltage to the optical shutter 32k at the timing at which the pulse laser beam L passes through the optical shutter 32k as described above, the time between the rise of the light emission trigger signal S2 and the start of the high voltage application needs to be constant. Specifically, when the time is constantly (B+C) and the high voltage has a waveform as illustrated with dashed line b in FIG. 5, the pulse laser beam L passes through the optical shutter 32k over the full pulse width. In addition, any unnecessary emission component of the pulse laser beam L at a pulse skirt can be removed through the optical shutter 32k.

However, in the high voltage switch 304, the time between the reception of the light emission synchronization trigger signal S10 and the start of the high voltage application varies with temperature change in some cases. When this time variation, what is called a time drift occurs, the high voltage waveform illustrated in FIG. 5 has, for example, a shape as illustrated with solid line c, and the time between the rise of the light emission trigger signal S2 and the start of the high voltage application may change to (B+C+D). Here, D represents the amount of change from the original value (B+C) of the time. In such a case, the pulse laser beam L can pass through the optical shutter 32k over part of the pulse width only, and thus attenuates as passing through the optical shutter 32k.

3. Embodiment 1

3.1 Configuration of Embodiment 1

Figure 6:
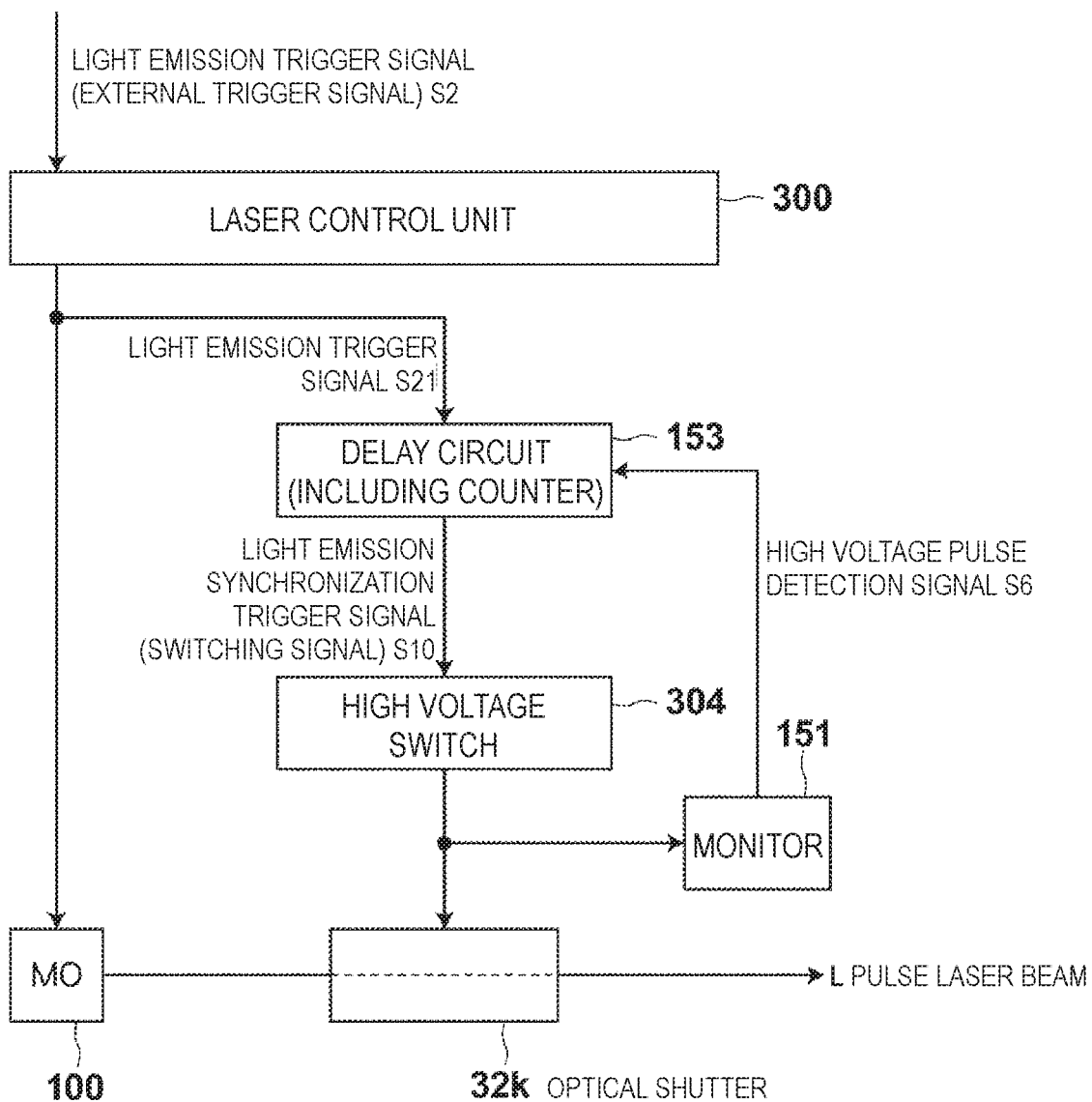
FIG. 6 is a block diagram illustrating a schematic configuration of a laser device according to Embodiment 1.
Figure 7:
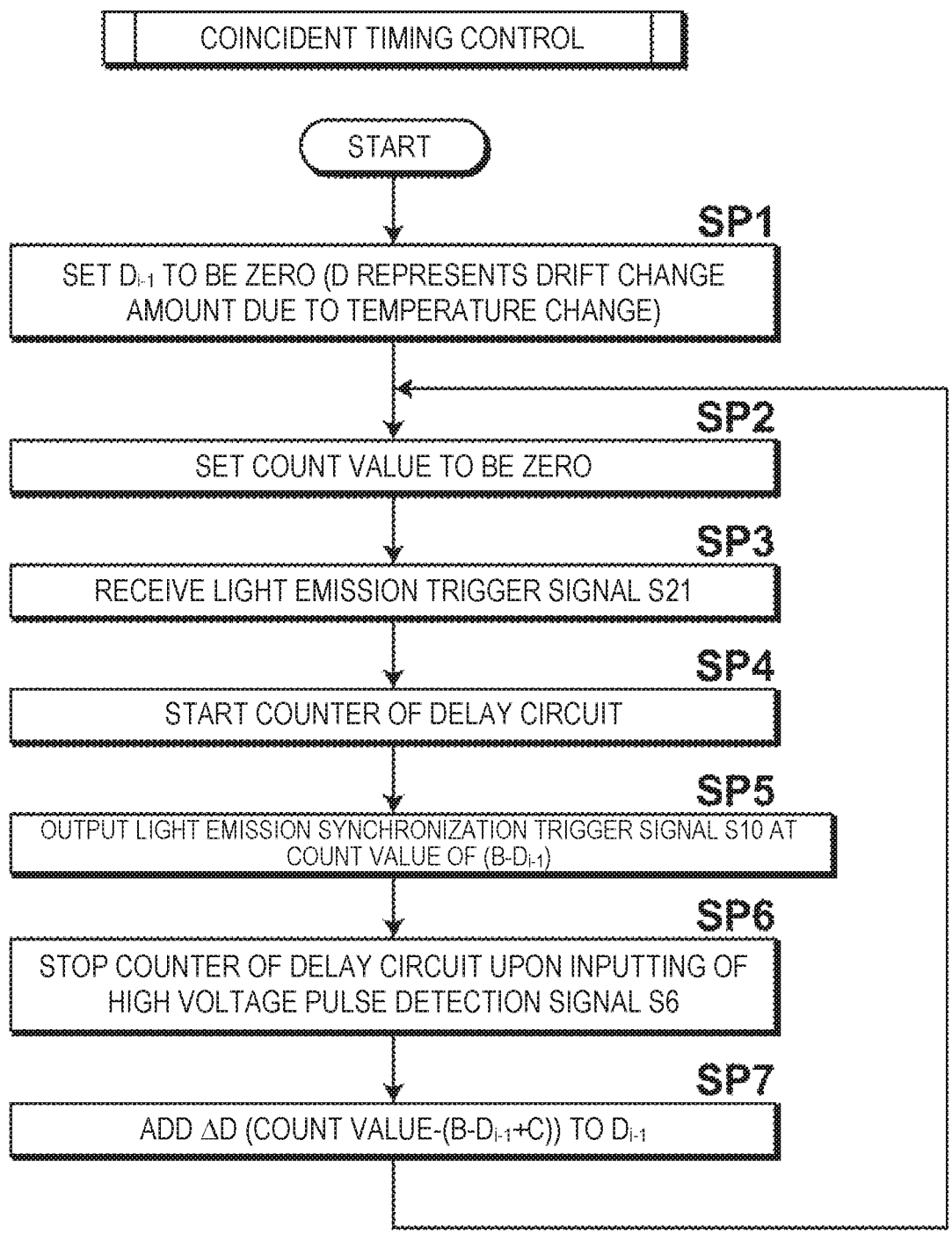
FIG. 7 is a flowchart illustrating the process of control processing at the laser device illustrated in FIG. 6.
Figure 8:
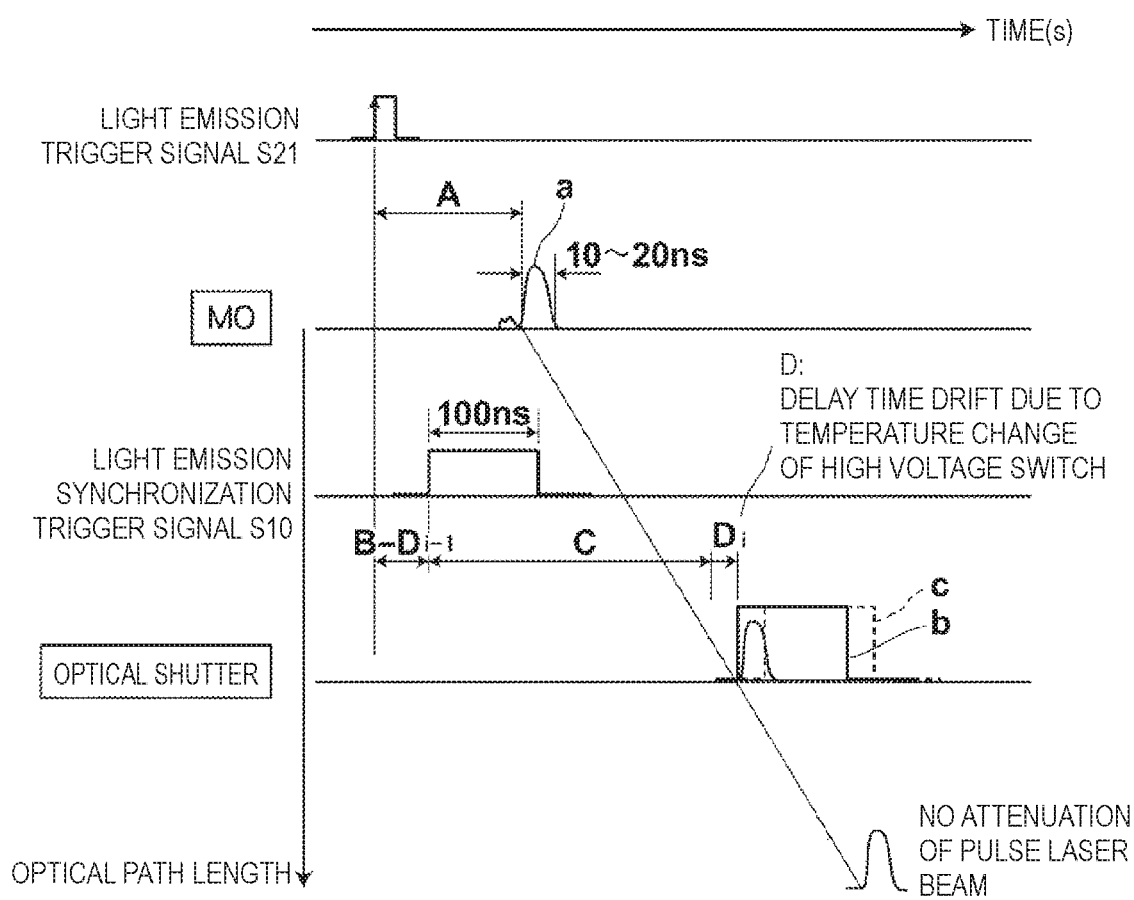
FIG. 8 is a timing chart illustrating the generation timing of each signal in the laser device illustrated in FIG. 6.

The following describes a laser device according to Embodiment 1 with reference to FIGS. 6 to 8. In FIGS. 6 to 8, any component identical to that in FIGS. 1 to 5 is denoted by an identical reference sign, and description thereof will be omitted unless needed otherwise (this also applies to the other following description). The laser device according to Embodiment 1 can be employed as the laser device 3 illustrated in FIGS. 1 and 2. FIG. 6 is a block diagram illustrating the basic configuration of the laser device according to Embodiment 1. This laser device is different from the laser device illustrated in FIG. 4 in that a high voltage monitor 151 is additionally provided and a delay circuit 153 including a counter is provided in place of the delay circuit 301. The counter counts elapsed time in units extremely shorter than a change amount D (refer to FIG. 5) of a time until the high voltage application starts after the high voltage switch 304 has received the light emission synchronization trigger signal S10. The high voltage monitor 151 senses a high voltage pulse output from the high voltage switch 304, and inputs a sensing signal S6 to the delay circuit 153.

3.2 Operation of Embodiment 1

FIG. 7 illustrates the process of control to cause the timing at which pulse high voltage is applied to the optical shutter 32$k$ to coincide with the timing at which the pulse laser beam L passes through the optical shutter 32$k$. FIG. 8 is a timing chart illustrating the generation timing of each signal under the control together with the progress position of the pulse laser beam L. The scheme of display in FIG. 8 is same as that in FIG. 5 described above. The control will be described below with reference to FIGS. 7 and 8.

When the control illustrated in FIG. 7 has started, the delay circuit 153 first sets the value of $D_{i-1}$ stored in the delay circuit 153 to be zero at step SP1. As illustrated in FIG. 8, D represents the above-described time change amount in the time until the high voltage application starts after the high voltage switch 304 has received the light emission synchronization trigger signal S10. More specifically, D represents a change from the time, which should be constant time C. In the control illustrated in FIG. 7, processing at steps SP2 to SP7 is repeated once the process has reached the next step SP2. The index i indicates the order of this repetition processing. $D_i$ represents the i-th time change amount in this order. The value of i is initially set to be one, and thus the value of $D_{i-1}$ is set to be zero as described above. The value of i is incremented by one each time the process returns to step SP2 from step SP7.

Subsequently at step SP2, the delay circuit 153 sets the count value of the counter of the delay circuit 153 to be zero. The delay circuit 153 receives, as an external trigger signal, the light emission trigger signal S2 illustrated in FIGS. 1 and 2 and outputs a light emission trigger signal S21 after a predetermined time has elapsed since the reception. As illustrated in FIG. 6, the light emission trigger signal S21 is simultaneously input to the MO 100 and the delay circuit 153. Having received the light emission trigger signal S21 at step SP3 in FIG. 7, the delay circuit 153 starts counting by the counter at the next step SP4.

At step SP5, when the count value becomes equal to $(B-D_{i-1})$, the delay circuit 153 outputs the light emission synchronization trigger signal S10, and accordingly, the high voltage switch 304 starts a switching operation to apply a high voltage pulse to the optical shutter 32$k$. In this manner, the light emission synchronization trigger signal S10 acts as a switching signal for starting the operation of the high voltage switch 304. The optical shutter 32$k$ allows light passing while the high voltage pulse is applied, and accordingly, the pulse laser beam L passes through the optical shutter 32$k$. The value B represents a target value of the delay time between the inputting of the light emission trigger signal S21 to the delay circuit 153 and the outputting of the light emission synchronization trigger signal S10 as illustrated in FIG. 8. However, the actual delay time in the Embodiment 1 is $(B-D_{i-1})$. The value C to be described later is a target value of the time between the rise of the light emission synchronization trigger signal S10 and the start of the high voltage pulse application to the optical shutter 32$k$. The target values B and C are predetermined constant values stored in, for example, the delay circuit 153.

The high voltage monitor 151 illustrated in FIG. 6 senses the high voltage pulse output from the high voltage switch 304 and inputs the sensing signal S6 to the delay circuit 153. Having received the high voltage pulse sensing signal S6, the delay circuit 153 stops the counting by the counter (step SP6 in FIG. 7). Subsequently at step SP7 after having stopped the counting by the counter, the delay circuit 153 adds a correction value ΔD to the value of $D_{i-1}$ and sets the sum as new $D_{i-1}$. The correction value ΔD=(the count value at the counting stop−$(B-D_{i-1}+C)$). After the processing at step SP7, the processing process returns to step SP2, and then the processing at steps SP2 to SP7 is repeated.

3.3 Effect of Embodiment 1

Through the processing described above, the delay time between the outputting of the light emission trigger signal S21 and the outputting of the light emission synchronization trigger signal S10 becomes equal to $(B-D_{i-1})$ as illustrated in FIG. 8. In other words, through the i-th repetition processing, the delay time becomes equal to a time obtained by subtracting, from the target value B, the time change amount $(D_{i-1})$ measured in the previous (i−1)-th repetition processing. Accordingly, the timing at which pulse high voltage is applied to the optical shutter 32$k$ coincides with the timing at which the pulse laser beam L passes through the optical shutter 32$k$ as illustrated with solid line b in FIG. 8. In other words, the pulse laser beam L passes through the optical shutter 32$k$ over the full pulse width, and thus the attenuation of the pulse laser beam L through the passing is reduced. In addition, any unnecessary emission component of the pulse laser beam L at a pulse skirt can be removed through the optical shutter 32$k$.

The timing at which pulse high voltage is applied to the optical shutter 32$k$ may be controlled based on detection of the pulse laser beam L. However, in this case, it cannot be determined whether decrease of the output of the pulse laser beam L is due to error in the timing of the high voltage application or MO output decrease, and thus such control is inaccurate.

4. Embodiment 2

4.1 Configuration of Embodiment 2

Figure 9:
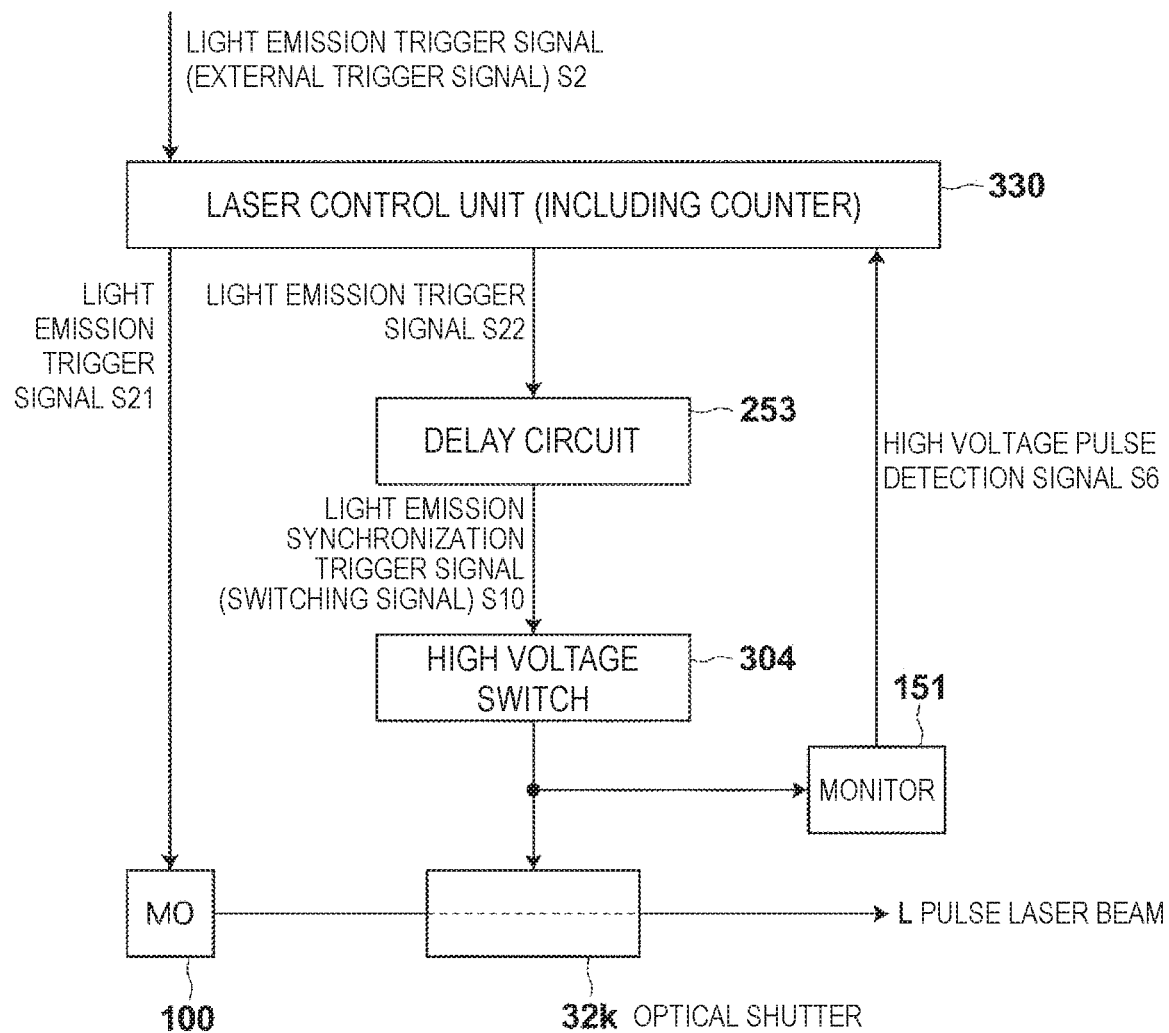
FIG. 9 is a block diagram illustrating a schematic configuration of a laser device according to Embodiment 2.
Figure 10:
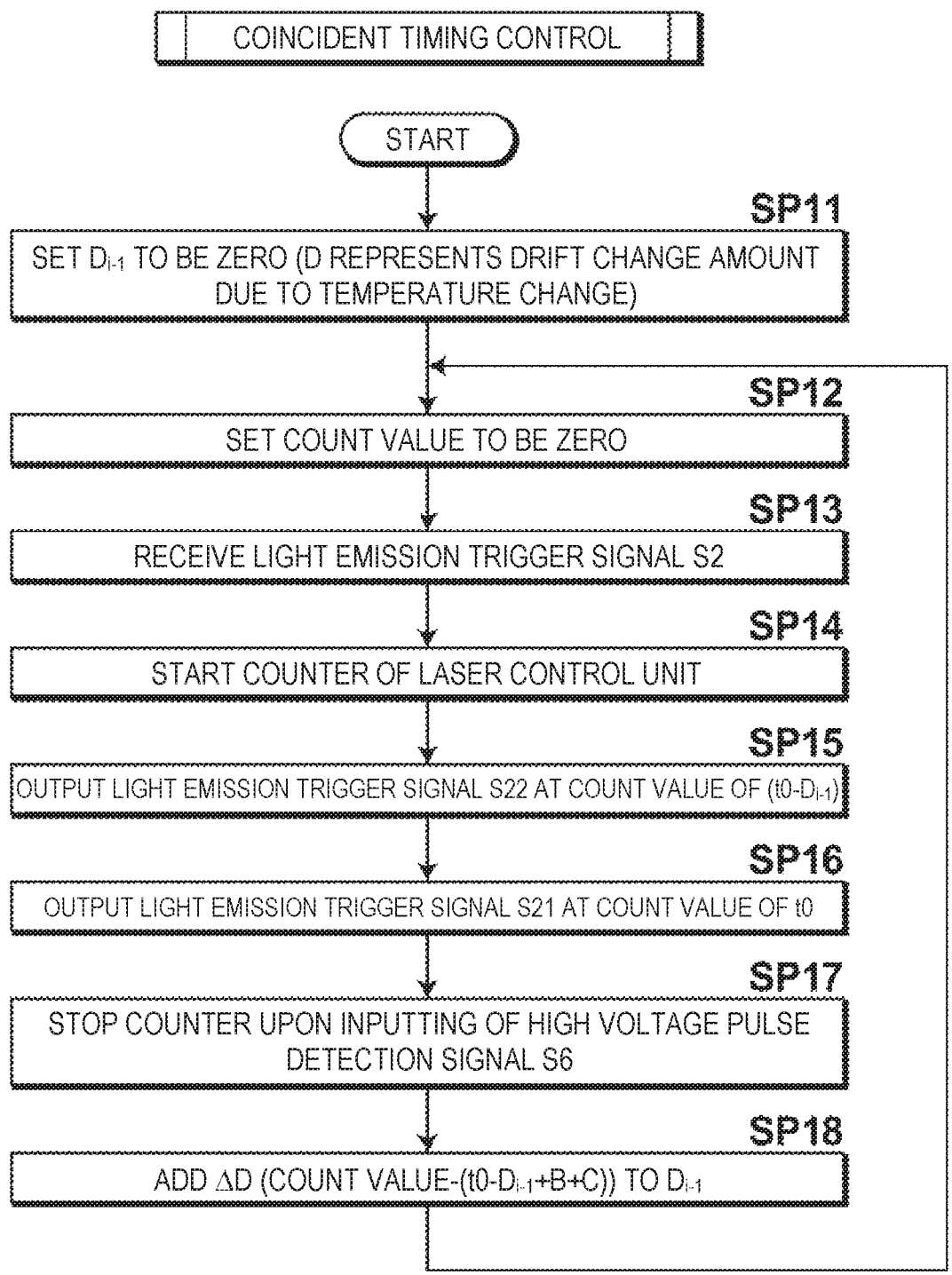
FIG. 10 is a flowchart illustrating the process of control processing at the laser device illustrated in FIG. 9.
Figure 11:
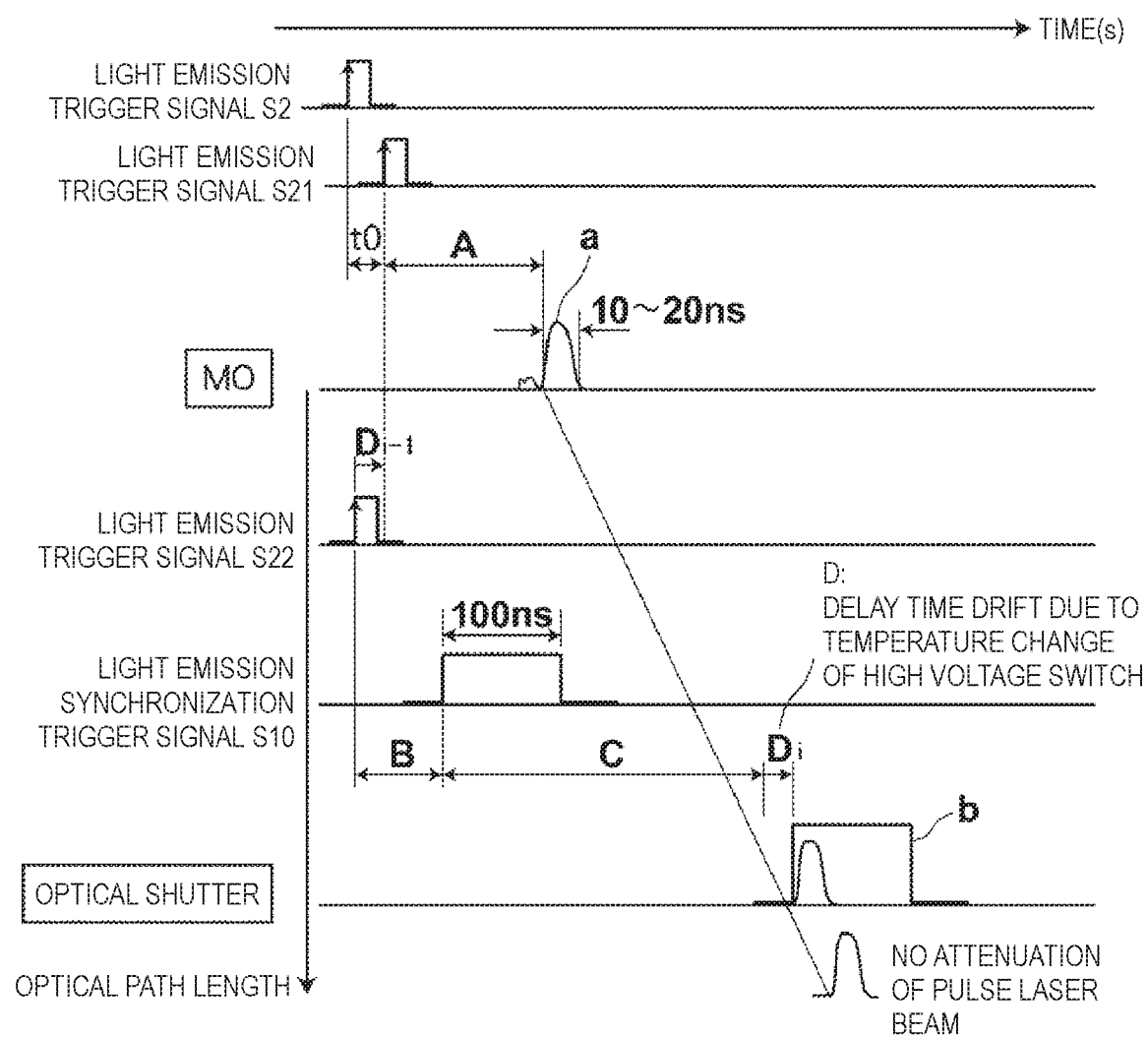
FIG. 11 is a timing chart illustrating the generation timing of each signal in the laser device illustrated in FIG. 9.

The following describes a laser device according to Embodiment 2 with reference to FIGS. 9 to 11. The laser device according to Embodiment 2 can be employed as the laser device 3 illustrated in FIGS. 1 and 2. FIG. 9 is a block diagram illustrating the basic configuration of the laser device according to Embodiment 2. This laser device is different from the laser device according to Embodiment 1 illustrated in FIG. 6 in that a laser control unit 330 including a counter is provided in place of the laser control unit 300, and a delay circuit 253 including no counter is provided in place of the delay circuit 153. The counter included in the laser control unit 330 counts elapsed time in units extremely shorter than the change amount D (refer to FIG. 5) of the time until the high voltage application starts after the high voltage switch 304 has received the light emission synchronization trigger signal S10. The high voltage monitor 151 senses the high voltage pulse output from the high voltage switch 304 and inputs the sensing signal S6 to the laser control unit 330.

4.2 Operation of Embodiment 2

The operation of the configuration in FIG. 9 is basically controlled by the laser control unit 330. FIG. 10 illustrates the process of this control, which is a control to cause the timing at which pulse high voltage is applied to the optical shutter 32k to coincide with the timing at which the pulse laser beam L passes through the optical shutter 32k. FIG. 11 is a timing chart illustrating the generation timing of each signal under the control together with the progress position of the pulse laser beam L. The scheme of display in FIG. 11 is same as that in FIG. 5 described above. The following describes the control by the laser control unit 330 with reference to FIGS. 10 and 11.

When the control illustrated in FIG. 10 has started, the laser control unit 330 first sets the value of $D_{i-1}$ stored in the laser control unit 330 to be zero at step SP11. The meanings of D, i, and $D_{i-1}$ are same as those in Embodiment 1. In this control, processing at steps SP12 to SP18 is repeated once the process has reached the next step SP12. The value of i is incremented by one each time the process returns from steps SP18 to SP12.

Subsequently at step SP12, the laser control unit 330 sets the count value of the counter to be zero. The laser control unit 330 receives, as an external trigger signal, the light emission trigger signal S2 illustrated in FIGS. 1 and 2. The laser control unit 330 receives the light emission trigger signal S2 at step SP13, and simultaneously starts counting by the counter at step SP14. Subsequently at step SP15, the laser control unit 330 outputs a second light emission trigger signal S22 when the count value becomes equal to $(t0-D_{i-1})$, and subsequently at step SP16, the laser control unit 330 outputs a first light emission trigger signal S21 when the count value becomes equal to t0. The value of t0 is a predetermined value and corresponds to first delay time in the present disclosure. The value of t0 is stored in the laser control unit 330. As illustrated in FIG. 9, the first light emission trigger signal S21 is input to the MO 100, and the second light emission trigger signal S22 is input to the delay circuit 253.

Having received the first light emission trigger signal S21, the MO 100 illustrated in FIG. 9 outputs the pulse laser beam L. Having received the second light emission trigger signal S22, the delay circuit 253 outputs the light emission synchronization trigger signal S10 as a switching signal after a time B described below has elapsed since the reception as illustrated in FIG. 11. The time B corresponds to a second delay time in the present disclosure. The light emission synchronization trigger signal S10 is input to the high voltage switch 304 illustrated in FIG. 9. Having received the light emission synchronization trigger signal S10, the high voltage switch 304 starts a switching operation to apply a high voltage pulse to the optical shutter 32k. The timing of the high voltage pulse application should be the timing at which time has elapsed by a target value C since the rise of the light emission synchronization trigger signal S10. However, when variation occurs to the time until the high voltage application starts after the high voltage switch 304 has received the light emission synchronization trigger signal S10, the actual timing is the timing at which time (C+D) has elapsed since the rise of the light emission synchronization trigger signal S10. The value D represents a time in the above-described change amount. The value $D_i$ illustrated in, for example, FIG. 11 represents the change amount at the i-th repetition processing. The target values B and C and the value of t0 are stored in, for example, the laser control unit 330. The target value B is also stored in the delay circuit 253.

The high voltage monitor 151 illustrated in FIG. 9 senses the high voltage pulse output from the high voltage switch 304, and inputs the sensing signal S6 to the laser control unit 330. Having received the high voltage pulse sensing signal S6, the laser control unit 330 stops the counting by the counter (step SP17 in FIG. 10). Subsequently at step SP18 after having stopped the counting by the counter, the laser control unit 330 adds the correction value ΔD to the value of $D_{i-1}$ and stores the sum as new $D_{i-1}$. In the present embodiment, the correction value ΔD=(the count value at the counting stop−(t0−$D_{i-1}$+B+C)). After the processing at step SP18, the processing process returns to step SP12, and then the processing at steps SP12 to SP18 is repeated.

4.3 Effect of Embodiment 2

Through the processing described above, the delay time between the outputting of the first light emission trigger signal S21 and the outputting of the light emission synchronization trigger signal S10 becomes equal to (B−$D_{i-1}$) as illustrated in FIG. 11. In other words, through the i-th repetition processing, the delay time becomes equal to a time obtained by subtracting, from the target value B, the time change amount ($D_{i-1}$) measured in the previous (i−1)-th repetition processing. Accordingly, the timing at which pulse high voltage is applied to the optical shutter 32k coincides with the timing at which the pulse laser beam L passes through the optical shutter 32k as illustrated with solid line b in FIG. 11. In other words, the pulse laser beam L passes through the optical shutter 32k over the full pulse width, and thus the attenuation of the pulse laser beam L through the passing is reduced. In addition, any unnecessary emission component of the pulse laser beam L at a pulse skirt can be removed through the optical shutter 32k.

5. Embodiment 3

5.1 Configuration of Embodiment 3

Figure 12:
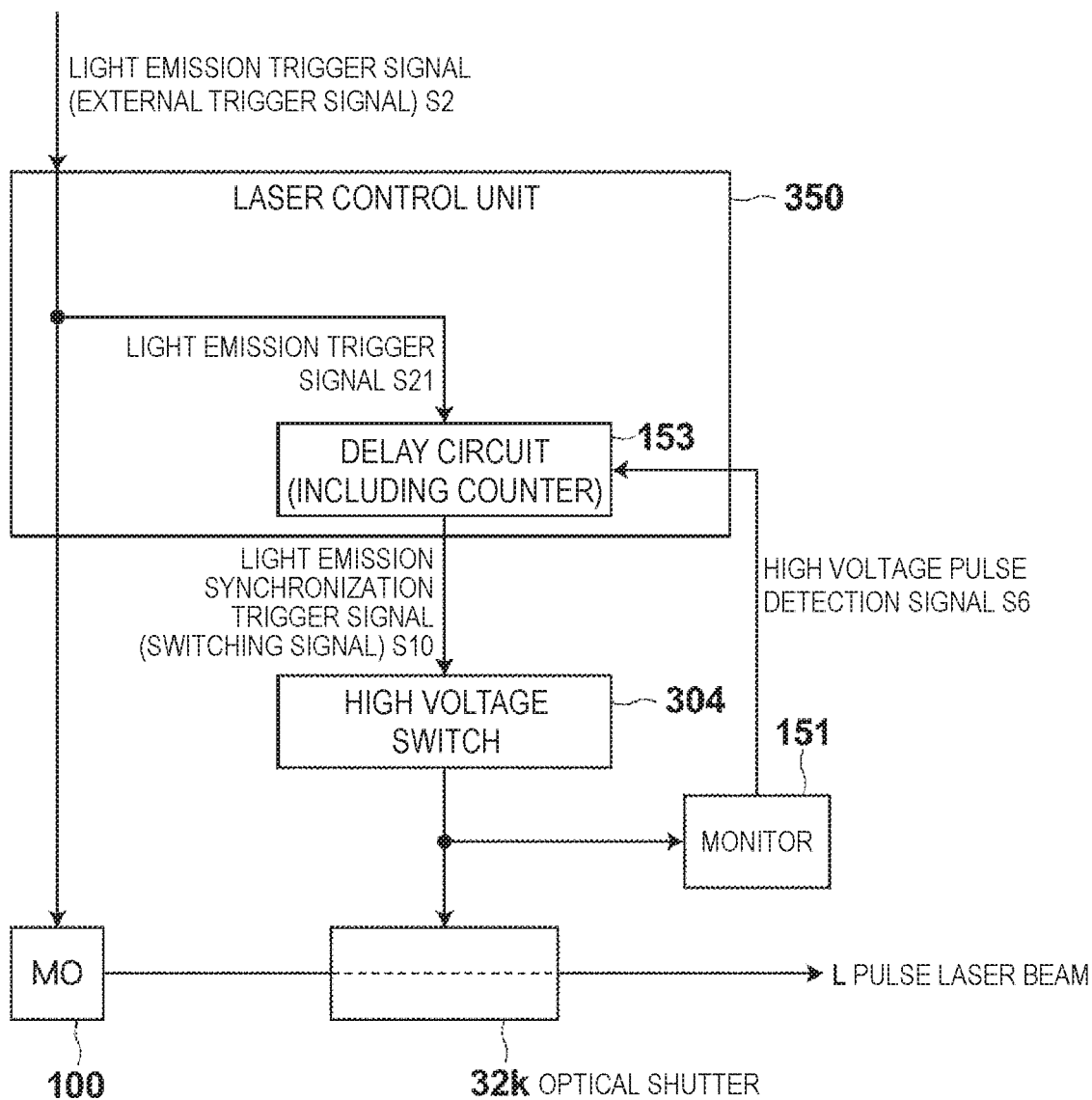
FIG. 12 is a block diagram illustrating a schematic configuration of a laser device according to Embodiment 3.
Figure 13:
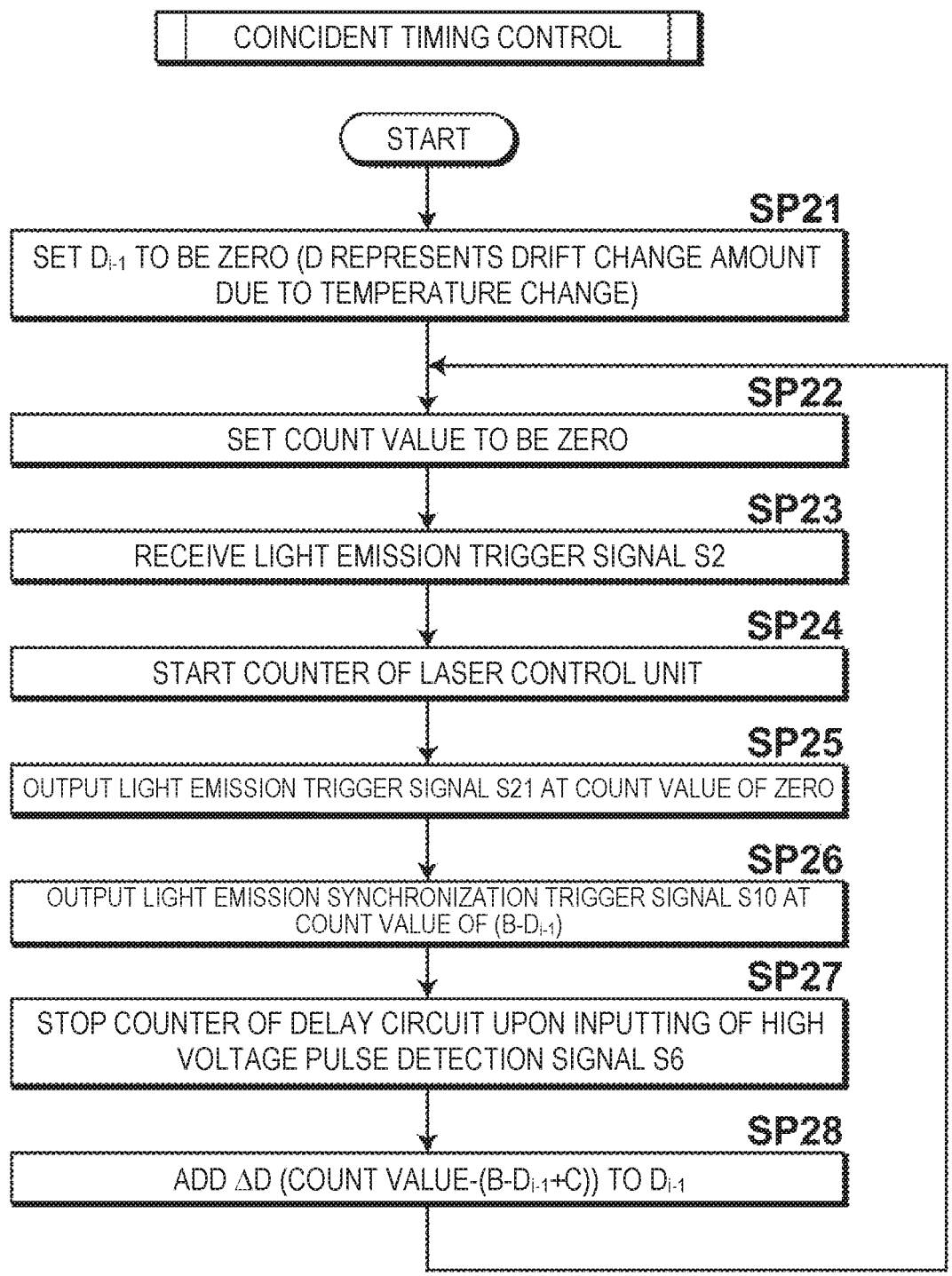
FIG. 13 is a flowchart illustrating the process of control processing at the laser device illustrated in FIG. 12.
Figure 14:
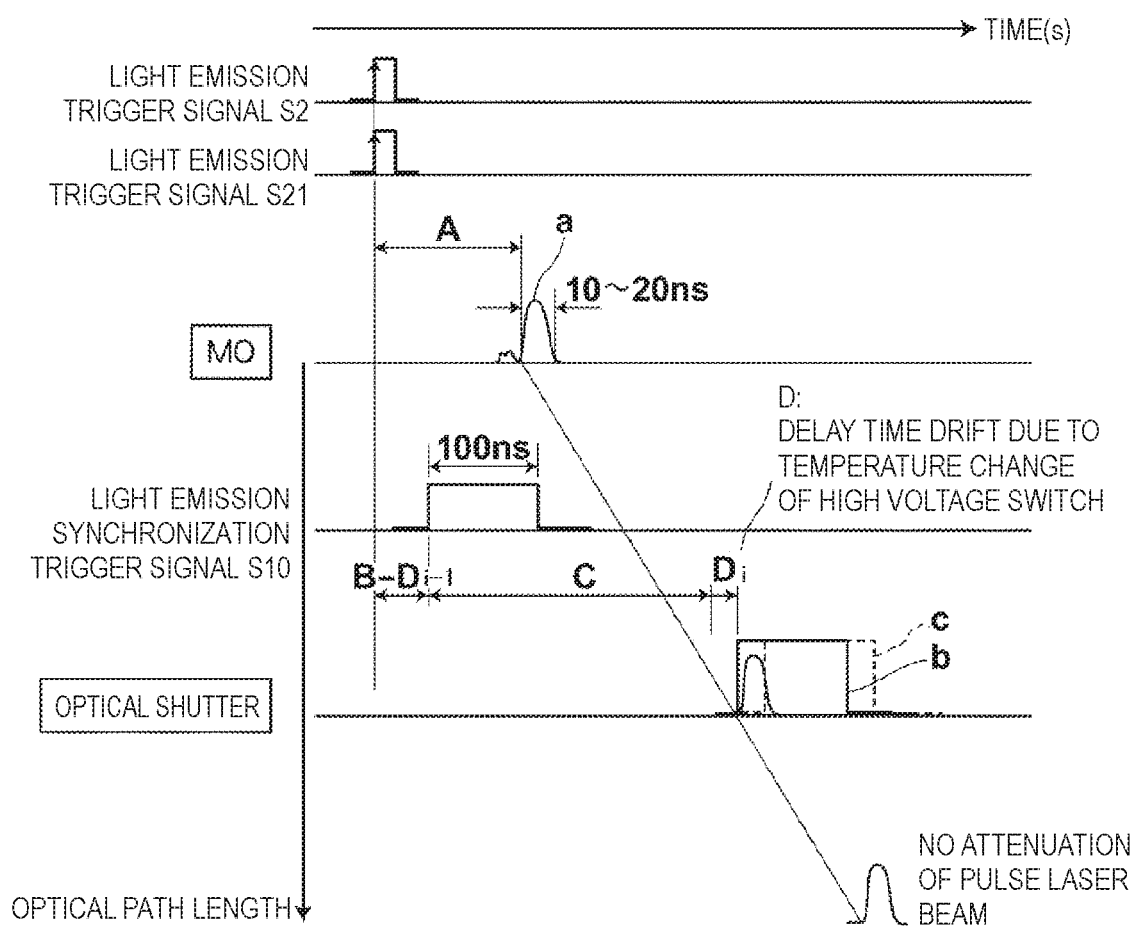
FIG. 14 is a timing chart illustrating the generation timing of each signal in the laser device illustrated in FIG. 12.

The following describes a laser device according to Embodiment 3 with reference to FIGS. 12 to 14. FIG. 12 is a block diagram illustrating the basic configuration of the laser device according to Embodiment 3. This laser device is different from the laser device according to Embodiment 1 illustrated in FIG. 6 in that a laser control unit 350 including the delay circuit 153 is provided in place of the laser control unit 300. The delay circuit 153 has a configuration and a function basically same as those of the delay circuit 153 illustrated in FIG. 6, and also includes the above-described counter.

5.2 Operation of Embodiment 3

The delay circuit 153 is controlled by the laser control unit 350. FIG. 13 illustrates the process of this control, which is a control to cause the timing at which pulse high voltage is applied to the optical shutter 32k to coincide with the timing at which the pulse laser beam L passes through the optical shutter 32k. FIG. 14 is a timing chart illustrating the generation timing of each signal under the control together with the progress position of the pulse laser beam L. The scheme of display in FIG. 14 is same as that in FIG. 5 described above. The following describes the control by the laser control unit 350 with reference to FIGS. 13 and 14.

The control illustrated in FIG. 13 is different from the control in Embodiment 1 illustrated in FIG. 7 in reception and outputting of the light emission trigger signals, but operation of the delay circuit 153 included in the laser control unit 350 is same as the operation thereof in Embodiment 1. In other words, steps SP21 and SP22 illustrated in FIG. 13 are same as steps SP1 and SP2 illustrated in FIG. 7, and steps SP26, SP27, and SP28 illustrated in FIG. 13 are same as steps SP5, SP6, and SP7 illustrated in FIG. 7. In the control unit illustrated in FIG. 13, the laser control unit 350 receives the light emission trigger signal S2 as an external trigger signal at step SP23, and then starts counting by the counter included in the laser control unit 350 at step SP24, and simultaneously outputs the light emission trigger signal S21 at step SP25.

In Embodiment 3, as illustrated in FIG. 14, the light emission synchronization trigger signal S10 as a switching signal is output a delay time $(B-D_{i-1})$ after the light emission trigger signal S2 as an external trigger signal is received by the laser control unit 350. The delay time $(B-D_{i-1})$ corresponds to a third delay time in the present disclosure.

5.3 Effect of Embodiment 3

With this configuration, Embodiment 3 achieves an effect basically same as that in Embodiment 1. Specifically, in the Embodiment 3 as well, the timing at which pulse high voltage is applied to the optical shutter 32k can be made coincide with the timing at which the pulse laser beam L passes through the optical shutter 32k as illustrated with solid line b in FIG. 14. In other words, the pulse laser beam L passes through the optical shutter 32k over the full pulse width, and thus the attenuation of the pulse laser beam L through the passing is reduced. In addition, any unnecessary emission component of the pulse laser beam L at a pulse skirt can be removed through the optical shutter 32k.

The above description is intended to provide not restriction but examples. Thus, the skilled person in the art would clearly understand that the embodiments of the present disclosure may be changed without departing from the scope of the claims.

Terms used throughout the present specification and the claims should be understood as non-limiting terms. For example, it should be understood that the terms "includes" and "included" mean that "the present invention is not limited to a subject described as being included". It should be understood that the term "has" means that "the present invention is not limited to a subject described as being had". It should be understood that the indefinite article "a" in the present specification and the claims means "at least one" or "one or more".

What is claimed is:

1. A laser device for an EUV system, comprising:
a laser control unit configured to generate a light emission trigger signal;
a master oscillator configured to output a pulse laser beam based on the light emission trigger signal transmitted from the laser control unit;
a delay circuit configured to receive the light emission trigger signal transmitted from the laser control unit and generate a switching signal after switching delay time F has elapsed since the reception;
a high voltage switch configured to generate a high voltage pulse based on the switching signal transmitted from the delay circuit;
an optical shutter positioned on an optical path of the pulse laser beam output from the master oscillator and driven based on the high voltage pulse output from the high voltage switch; and
a high voltage monitor configured to detect the high voltage pulse output from the high voltage switch and, based on the high voltage pulse output, transmit a high voltage pulse sensing signal to the delay circuit, wherein
when C represents a target value of a time between rise of the switching signal and application of the high voltage pulse to the optical shutter, and D represents a change amount by which timing of the application of the high voltage pulse shifts from the target value C toward a longer time side, wherein D is determined based on the high voltage pulse sending signal, and wherein the delay circuit updates the switching delay time to be F−D, every time the delay circuit receives the light emission trigger signal.

2. The laser device for an EUV system according to claim 1, wherein the delay circuit includes a counter configured to count at least an elapsed time since reception of the light emission trigger signal.

3. The laser device for an EUV system according to claim 2, wherein the delay circuit stops the counting by the counter when the high voltage pulse sensing signal is input, and calculates the change amount D based on a counted elapsed time.

4. The laser device for an EUV system according to claim 1, wherein a plurality of the optical shutters are provided along the optical path of the pulse laser beam.

5. The laser device for an EUV system according to claim 1, further comprising an amplifier configured to amplify the pulse laser beam output from the master oscillator.

6. An extreme ultraviolet light generation device configured to generate extreme ultraviolet light by irradiating a droplet made of a target material with a pulse laser beam, the extreme ultraviolet light generation device comprising the laser device for an EUV system according to claim 1 as a light source configured to emit the pulse laser beam.

7. A laser device for an EUV system, comprising:
a laser control unit configured to receive an external trigger signal, generate a first light emission trigger signal after a first delay time has elapsed since the reception, and generate a second light emission trigger signal based on the external trigger signal;
a master oscillator configured to output a pulse laser beam based on the first light emission trigger signal transmitted from the laser control unit;
a delay circuit configured to receive the second light emission trigger signal transmitted from the laser control unit and generate a switching signal after a second delay time T0 has elapsed since the reception;
a high voltage switch configured to generate a high voltage pulse based on the switching signal transmitted from the delay circuit;
an optical shutter positioned on an optical path of the pulse laser beam output from the master oscillator and driven based on the high voltage pulse output from the high voltage switch; and
a high voltage monitor configured to detect the high voltage pulse output from the high voltage switch and based on the high voltage pulse output, transmit a high voltage pulse sensing signal to the laser control unit, wherein
when C represents a target value of a time between rise of the switching signal and application of the high voltage pulse to the optical shutter, and D represents a change amount by which timing of the application of the high voltage pulse shifts from the target value C toward a longer time side, wherein D is determined based on the high voltage pulse sending signal, and wherein the delay circuit updates the second delay time to be T0−D, every time the delay circuit receives the second light emission trigger signal.

8. The laser device for an EUV system according to claim 1, wherein
a frequency of updating the first delay time is set to be 50 kHz to 100 kHz.

9. The laser device for an EUV system according to claim 7, wherein the laser control unit includes a counter configured to count at least an elapsed time from reception of the external trigger signal.

10. The laser device for an EUV system according to claim 9, wherein the laser control unit stops the counting by the counter when the high voltage pulse sensing signal is input, and calculates the change amount D based on a counted elapsed time.

11. The laser device for an EUV system according to claim 7, wherein a plurality of the optical shutters are provided along the optical path of the pulse laser beam.

12. The laser device for an EUV system according to claim 7 further comprising an amplifier configured to amplify the pulse laser beam output from the master oscillator.

13. An extreme ultraviolet light generation device configured to generate extreme ultraviolet light by irradiating a droplet made of a target material with a pulse laser beam, the extreme ultraviolet light generation device comprising the laser device according to claim 7 as a light source configured to emit the pulse laser beam.

14. A laser device for an EUV system, comprising:
a laser control unit configured to generate a light emission trigger signal based on a received external trigger signal and generate a switching signal after a third delay time B has elapsed since the reception of the external trigger signal;
a master oscillator configured to output a pulse laser beam based on the light emission trigger signal transmitted from the laser control unit;
a high voltage switch configured to generate a high voltage pulse based on the switching signal transmitted from the laser control unit;
an optical shutter positioned on an optical path of the pulse laser beam output from the master oscillator and driven based on the high voltage pulse output from the high voltage switch; and
a high voltage monitor configured to detect the high voltage pulse output from the high voltage switch and, based on the high voltage pulse output, transmit a high voltage pulse sensing signal to the laser control unit, wherein
when C represents a target value of a time between rise of the switching signal and application of the high voltage pulse to the optical shutter, and D represents a change amount by which timing of the application of the high voltage pulse shifts from the target value C toward a longer time side, wherein D is determined based on the high voltage pulse sending signal, and wherein the laser control unit updates the third delay time to be B−D, every time the laser control unit receives received external trigger signal.

15. The laser device for an EUV system according to claim 14, wherein the laser control unit includes a counter configured to count at least an elapsed time since reception of the light emission trigger signal.

16. The laser device for an EUV system according to claim 15, wherein the laser control unit stops the counting by the counter when the high voltage pulse sensing signal is input, and calculates the change amount D based on a counted elapsed time.

17. The laser device for an EUV system according to claim 14, wherein a plurality of the optical shutters are provided along the optical path of the pulse laser beam.

18. An extreme ultraviolet light generation device configured to generate extreme ultraviolet light by irradiating a droplet made of a target material with a pulse laser beam, the extreme ultraviolet light generation device comprising the laser device according to claim 14 as a light source configured to emit the pulse laser beam.

* * * * *